United States Patent
Gawase et al.

(10) Patent No.: US 10,283,383 B2
(45) Date of Patent: May 7, 2019

(54) PLANARIZATION METHOD AND PLANARIZATION APPARATUS

(71) Applicant: Toshiba Memory Corporation, Minato-ku (JP)

(72) Inventors: Akifumi Gawase, Mie-ken (JP); Yukiteru Matsui, Aichi-ken (JP); Gaku Minamihaba, Kanagawa-ken (JP); Hajime Eda, Mie-ken (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 737 days.

(21) Appl. No.: 14/826,966

(22) Filed: Aug. 14, 2015

(65) Prior Publication Data

US 2015/0357212 A1     Dec. 10, 2015

Related U.S. Application Data

(62) Division of application No. 14/021,413, filed on Sep. 9, 2013, now Pat. No. 9,144,879.

(30) Foreign Application Priority Data

Feb. 5, 2013 (JP) ................. 2013-020943

(51) Int. Cl.
*H01L 21/67* (2006.01)
*B24B 37/04* (2012.01)
*H01L 21/3105* (2006.01)
*H01L 21/762* (2006.01)

(52) U.S. Cl.
CPC ...... *H01L 21/67075* (2013.01); *B24B 37/044* (2013.01); *H01L 21/31055* (2013.01); *H01L 21/67092* (2013.01); *H01L 21/76283* (2013.01)

(58) Field of Classification Search
None
See application file for complete search history.

(56) References Cited

U.S. PATENT DOCUMENTS

| 7,651,625 | B2 | 1/2010 | Yamauchi et al. | |
|---|---|---|---|---|
| 9,144,879 | B2* | 9/2015 | Gawase | B24B 37/044 |
| 2004/0177867 | A1* | 9/2004 | Schilling | B08B 7/0021 134/26 |
| 2006/0255012 | A1* | 11/2006 | Jacobson | H01L 21/02101 216/83 |
| 2007/0084483 | A1* | 4/2007 | Freer | B08B 3/00 134/6 |

(Continued)

FOREIGN PATENT DOCUMENTS

JP 2008-81389 A 4/2008
JP 2011-146695 A 7/2011

*Primary Examiner* — Jason Y Ko
*Assistant Examiner* — Cristi J Tate-Sims
(74) *Attorney, Agent, or Firm* — Oblon, McClelland, Maier & Neustadt, L.L.P.

(57) ABSTRACT

According to one embodiment, a planarization method and a planarization apparatus are provided. In the planarization method, a work surface of a work piece is planarized by bringing the work surface of the work piece containing a silicon oxide film and a surface of a solid plate onto which hydrogen ions are adsorbed, into contact or extremely close proximity with one another in a state in which a process liquid containing fluorine ions is supplied to the surface of the solid plate.

13 Claims, 4 Drawing Sheets

(56) References Cited

U.S. PATENT DOCUMENTS

| | | | |
|---|---|---|---|
| 2008/0073222 A1* | 3/2008 | Yamauchi | C23C 8/40 205/655 |
| 2009/0095712 A1* | 4/2009 | Yamauchi | H01L 21/02019 216/53 |
| 2010/0029181 A1* | 2/2010 | De Rege Thesauro | B24B 37/044 451/37 |
| 2011/0152151 A1* | 6/2011 | Kolics | C11D 3/0073 510/175 |
| 2012/0244649 A1* | 9/2012 | Sano | B24B 37/0053 438/17 |

* cited by examiner

PLANARIZATION METHOD AND PLANARIZATION APPARATUS

CROSS-REFERENCE TO RELATED APPLICATION

This application is a divisional of U.S. application Ser. No. 14/021,413 filed Sep. 9, 2013, and is based upon and claims the benefit of priority from Japanese Patent Application No. 2013-020943, filed Feb. 5, 2013; the entire contents of each of which are incorporated herein by reference.

FIELD

Embodiments described herein relate generally to a planarization method and a planarization apparatus.

BACKGROUND

In recent years, in the manufacturing of semiconductor devices, the Chemical Mechanical Polishing (CMP) method is in wide use for planarizing insulating films, metal films, polycrystalline silicon films or the like formed to fill in grooves formed on a substrate. The CMP method is a method which supplies a polishing agent (a slurry) containing abrasive grains and a chemical solution onto a polishing cloth and brings a work piece into contact with the polishing cloth, thereby planarizing a work surface by combining the chemical action of the chemical solution and the mechanical action of the abrasive grains. However, in the CMP method, mechanical damage caused by the abrasive grains may not be avoided, and there is a problem in that abrasion damage occurs on the work surface.

In relation to the problem, a method is being considered which avoids abrasion damage to the work surface by using a process liquid which does not contain the abrasive grains. For example, there is a method of planarizing a metal film surface by using the temperature rise of a portion in contact with the polishing cloth to chemically dissolve the heated portion with the process liquid. There is also a method of planarizing a silicon film, a silicon carbide film, a gallium nitride film, an aluminum oxide film, a metal film, or the like by bringing the work piece into contact with a solid plate formed from a catalyst and chemically dissolving a contacting portion using the process liquid.

However, there is no method proposed which planarizes a silicon oxide film essential for the manufacturing of semiconductor devices.

DETAILED DESCRIPTION

Figure 1:
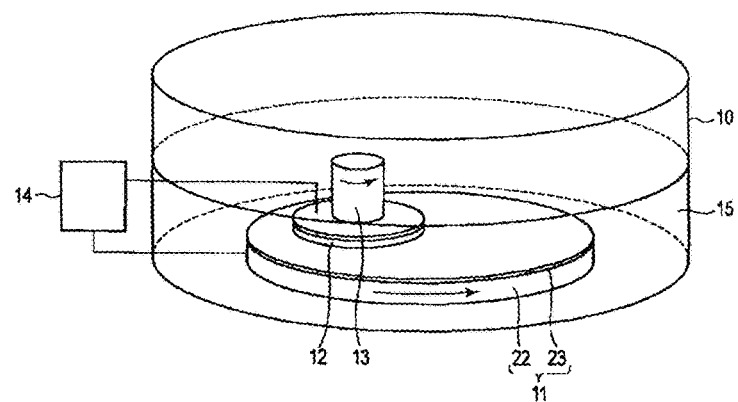
FIG. 1 is a perspective view showing a configuration example of a planarization apparatus which planarizes a silicon oxide film according to a first embodiment.

In general, according to one embodiment, a planarization method and a planarization apparatus are provided which can suppress abrasion damage to a work surface of a work piece containing a silicon oxide film.

According to the embodiment, the planarization method is provided. In the planarization method, the work surface of the work piece is planarized by bringing the work surface of the work piece containing the silicon oxide film and a surface of a solid plate onto which hydrogen ions are adsorbed, into contact or extremely close proximity with one another in a state in which a process liquid containing fluorine ions is supplied to the surface of the solid plate.

The present embodiment will be described below with reference to the drawings. In the drawings, the same portions are assigned the same reference numerals. In addition, duplicate description will be given where necessary.

First Embodiment

The planarization method according to the present embodiment will be described using FIGS. 1 to 3. The present embodiment is an example in which a work surface of a work piece 12 which contains a silicon oxide film 21 is brought into contact with a surface of a solid plate 11, onto which hydrogen (H) ions 23 are adsorbed, within a process liquid 15 containing fluorine (F) ions. Therefore the work surface of the silicon oxide film which is in contact with the surface of the solid plate 11 is chemically dissolved, and the work surface is planarized. In the present embodiment, since mechanical polishing is not necessary, the abrasion damage to the work surface can be suppressed. The present embodiment will be described below.

[Planarization Apparatus]

First, the planarization apparatus which performs planarization of a silicon oxide film according to the present embodiment will be described using FIG. 1. FIG. 1 is a perspective view showing a configuration example of the planarization apparatus which planarizes a silicon oxide film according to the present embodiment.

As shown in FIG. 1, the planarization apparatus according to the present embodiment includes a container 10, the solid plate 11, a maintaining portion 13, a heat source 14 and the like.

The container 10 is filled with the process liquid 15 by a process liquid supply unit (not shown). The process liquid 15 is a neutral or acidic solution with a pH of 7 or lower containing fluorine ions 24. A sodium fluoride aqueous solution, a potassium fluoride aqueous solution, an ammonium fluoride aqueous solution, and a mixture of the above and a hydrogen fluoride aqueous solution are used as the process liquid 15.

The solid plate 11 is arranged inside of the container 10 so as to be immersed in the process liquid 15. The solid plate 11 contains a solid acidic catalyst 22 in at least the surface, and the hydrogen ions 23 are adsorbed onto the surface. A weak acidic cation exchanger is preferable as the solid acidic catalyst 22. An example of the weak acidic cation exchanger is a cation exchanger having a functioning group with an acid dissociation constant of $1.0\times10^{-3}$ or less, specifically, a cation exchanger including a carboxyl group. Accordingly, of the cations contained in the process liquid 15, the hydrogen ions 23 can be selectively adsorbed. In particular, the hydrogen ions 23 in the process liquid 15 can be selectively adsorbed by giving the cation exchanger a functioning group with a small acid dissociation constant.

The maintaining portion 13 maintains the work piece 12. The maintaining portion 13 causes the work surface of the work piece 12 to oppose the surface of the solid plate 11, and can cause the work surface of the work piece 12 and the surface of the solid plate 11 to contact and separate in relation to one another. The amount of the process liquid 15 within the container 10 is adjusted so that a contacting portion between the work surface of the work piece 12 and the surface of the solid plate 11 is immersed in the process liquid 15. As described below, the work surface of the work piece 12 can be planarized by bringing the work surface (the silicon oxide film 21) of the work piece 12 and the surface (the hydrogen ions 23) of the solid plate 11 into contact or extremely close proximity with one another within the process liquid 15 (contains the fluorine ions 24).

In addition, the solid plate 11 and the maintaining portion 13 are both rotatable. Even if the hydrogen ions 23 adsorbed onto the surface of the solid plate 11 are lost due to the contact with the work surface of the work piece 12 by bringing the solid plate 11 and the maintaining portion 13 into contact with one another while rotating, the hydrogen ions 23 are newly adsorbed onto the surface of the solid plate 11 by re-immersing the solid plate 11 and the maintaining portion 13 in the process liquid 15. Furthermore, the movement is not limited to rotation, and the solid plate 11 and the maintaining portion 13 may also be caused to slide in relation to one another.

The heat source 14 is connected to the solid plate 11 and the work piece 12 and causes the temperature of the contacting portion to rise. Accordingly, the reaction between the solid plate 11 and the work piece 12 to be described below is promoted, and the process speed of the work piece 12 can be improved. In addition, the reaction between the solid plate 11 and the work piece 12 can also be promoted by raising the temperature of the process liquid 15 using the heat source 14.

In addition, by bringing the solid plate 11 and the maintaining portion 13 into contact with one another while rotating or sliding the solid plate 11 and the maintaining portion 13 as described above, frictional heat is generated and the temperature of the contacting portion can be raised. In other words, even if the heat source 14 is not used, the temperature of the contacting portion is raised and the reaction between the solid plate 11 and the work piece 12 can be promoted.

Furthermore, in the present example, an example in which the solid plate 11 is fixed within the container 10 and the work piece 12 maintained in the maintaining portion 13 is moved to bring the work piece 12 into contact with the solid plate 11, however, the example is not limited thereto. The work piece 12 and the solid plate 11 may be brought into contact with one another by fixing the work piece 12 within the container 10 and moving the solid plate 11 maintained in the maintaining portion 13.

[Methods and Principles of Planarization]

Next, the methods and the principles of the planarization of the silicon oxide film according to the present embodiment will be described using FIGS. 2 and 3. FIGS. 2 and 3 are cross section views which show the processes and the principles of the planarization of the silicon oxide film according to the present embodiment.

Furthermore, here, an example will be shown in which the work piece 12 is formed from a substrate 20 and the silicon oxide film 21 formed on an upper portion thereof, and a surface of the silicon oxide film 21 is the work surface. The substrate 20 is, for example, a semiconductor substrate, a glass substrate, or an insulating film or the like formed on a semiconductor substrate. In addition, the solid plate 11 contains the solid acidic catalyst 22 in at least the surface, and the hydrogen ions 23 are adsorbed onto the surface. In addition, the maintaining portion 13 and the heat source 14 in FIG. 1 are omitted.

Figure 2:
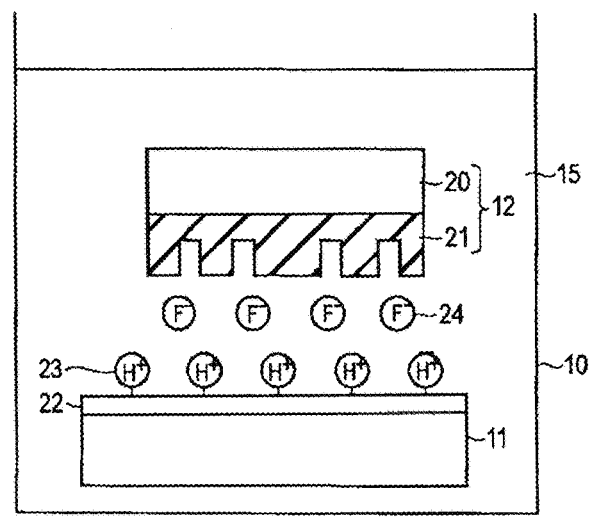
FIG. 2 is a cross section view showing the processes and the principles of the planarization of the silicon oxide film according to the first embodiment.

First, as shown in FIG. 2, the work piece 12 is maintained within the process liquid 15 such that the work surface of the work piece 12 containing the silicon oxide film 21 opposes the surface of the solid plate 11. The work surface of the silicon oxide film 21 has an irregular shape. The solid acidic catalyst 22 is provided on the solid plate 11. Since the solid acidic catalyst 22 adsorbs the hydrogen ions 23 in the process liquid 15, the hydrogen ions 23 are adsorbed onto the surface of the solid plate 11. In addition, the hydrogen ions 23 may also be adsorbed onto the surface of the solid plate 11, for example, by immersing the solid acidic catalyst 22 in a hydrofluoric acid solution in advance.

Figure 3:
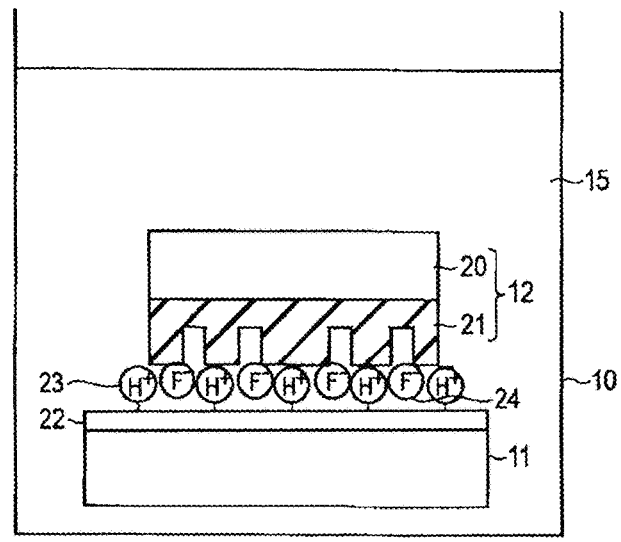
FIG. 3 is a cross section view continuing from FIG. 2, which shows the processes and the principles of the planarization of the silicon oxide film according to the first embodiment.

Next, as shown in FIG. 3, the work surface of the work piece 12 is brought into contact or extremely close proximity with the surface of the solid plate 11 by moving the work piece 12 within the process liquid 15. At this time, at least the contacting portion or a close proximity portion between the work surface of the work piece 12 and the surface of the solid plate 11 is immersed in the process liquid 15. Accordingly, the hydrogen ions 23 of the surface of the solid plate 11 are attracted to the oxygen of the work surface, and together with the fluorine ions 24 contained within the process liquid 15, dissolve the silicon oxide film 21 of the work surface. Within the work surface, since the reaction progresses preferentially in convex portions of the silicon oxide film 21 in contact or extremely close proximity with the solid plate 11, the work surface is planarized. More specifically, silicon dioxide ($SiO_2$) of the work surface, the fluorine ions ($F^-(HF_2^-)$) 24 within the process liquid 15 and the hydrogen ions ($H^+(H_3O^+)$) 23 adsorbed onto the surface of the solid plate 11 cause the following reaction.

$$SiO_2 + 6F^- + 6H^+ \rightarrow SiF_6^{2-} + 2H^+ + 2H_2O \tag{1}$$

In other words, the fluorine ions and silicon bonds and are dissolved within the process liquid 15 as hexafluorosilicic acid ions ($SiF_6^{2-}$).

Furthermore, here, the term "extremely close proximity" refers to bringing the work surface of the work piece 12 into close proximity with the surface of the solid plate 11 to an extent at which the hydrogen ions 23 dissociate from the surface of the solid plate 11 and the reaction (1) occurs.

In addition, the reaction of reaction formula (1) progresses continually at a sufficient speed. Therefore, the movement speed (the pressure pushing against the solid plate 11) of the work piece 12 is not particularly limited. In other words, the work piece 12 moves at an arbitrary speed and is brought into contact or extremely close proximity with the solid plate 11.

Furthermore, according to the type of the solid acidic catalyst 22 or the process liquid 15, there is a case in which a sufficient reaction speed may not be obtained by just bringing the work piece 12 and the solid plate 11 into contact or extremely close proximity with one another. In this case, the reaction can be caused to proceed efficiently by raising the temperature of the contacting portion between the work piece 12 and the solid plate 11.

For example, the heat source 14 is connected to the solid plate 11 and the work piece 12, therefore the temperature thereof can be raised. In addition, the reaction between the solid plate 11 and the work piece 12 can also be promoted by raising the temperature of the process liquid 15 using the heat source 14.

In addition, by bringing the solid plate 11 and the maintaining portion 13 into contact with one another while rotating the solid plate 11 and the maintaining portion 13, frictional heat is generated and the temperature can be raised. Furthermore, the movement is not limited to rotation, and the solid plate 11 and the maintaining portion 13 may also be caused to slide in relation to one another, thereby generating frictional heat and raising the temperature.

Subsequently, when the planarization of the work surface finishes, the work piece 12 is separated from the solid plate 11. At this time, the hydrogen ions contained within the process liquid 15 are re-adsorbed onto the surface of the solid plate 11 which the work piece 12 was in contact with, and the surface state becomes the same as before the process. In addition, before processing the next work piece, the hydrogen ions 23 may also be adsorbed onto the surface of the solid plate 11, for example, by immersing the solid acidic catalyst 22 in a hydrofluoric acid solution.

Furthermore, the silicon oxide film described in the present embodiment is not limited to a silicon dioxide ($SiO_2$) film, and may also be a silicon oxide film formed using the CVD method with silane and TEOS (tetraethylorthosilicate) as raw materials, or a silicon oxide film formed using the polysiloxane (PSX) coating method. In addition, the silicon oxide film may also contain other elements such as boron and phosphor.

[Effects]

According to the embodiment described above, within the process liquid 15 containing the fluorine ions 24, the work surface of the work piece 12 (the silicon oxide film 21) is brought into contact with the surface of the solid plate 11 onto which the hydrogen ions 23 are adsorbed. Accordingly, the work surface of the silicon oxide film 21 which is in contact with the solid plate 11 is chemically dissolved, and the work surface is planarized. In other words, the silicon oxide film 21 can be planarized using only a chemical reaction without mechanical polishing. Therefore, the abrasion damage to the work surface of the silicon oxide film 21, which occurs due to the mechanical polishing, can be suppressed.

Incidentally, if both the hydrogen ions and the fluorine ions are present, the hydrogen ions and the fluorine ions can be reacted with the silicon oxide film to dissolve the silicon oxide film. Therefore, by immersing the silicon oxide film in a hydrofluoric acid solution, the silicon oxide film and the hydrofluoric acid solution can be reacted with one another. However, if the silicon oxide film is only immersed in the hydrofluoric acid solution, the silicon oxide film is processed isotropically and the work surface may not be planarized.

In contrast, in the present embodiment, the silicon oxide film 21 is immersed in the process liquid 15 containing the fluorine ions 24 which do not react by immersion only, and the work surface is brought into contact or extremely close proximity with the surface of the solid plate 11 containing the hydrogen ions 23. Accordingly, the work surface of the silicon oxide film 21 can be planarized by reacting only the work surface of the silicon oxide film 21 which is in contact or extremely close proximity with the surface of the solid plate 11.

Second Embodiment

The planarization apparatus according to the present embodiment will be described using FIGS. 4 and 5.

[Planarization Apparatus]

Figure 4:
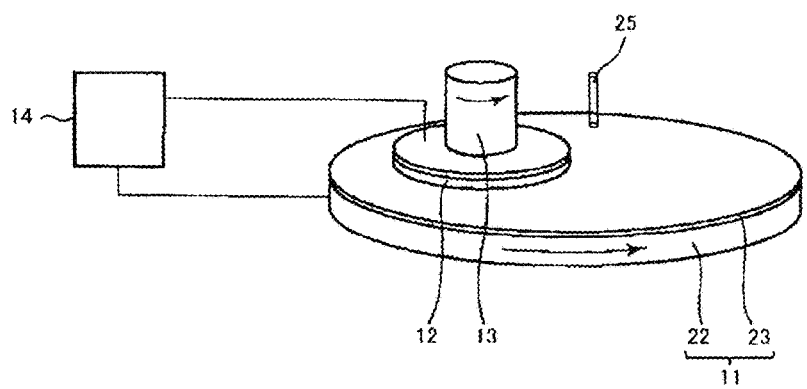
FIG. 4 is a perspective view showing a configuration example of a planarization apparatus which planarizes a silicon oxide film according to a second embodiment.

FIG. 4 is a perspective view showing a configuration example of a planarization apparatus which planarizes a silicon oxide film according to the second embodiment. In the second embodiment, the process liquid 15 is not stored in the container 10 as in the first embodiment, and the process liquid 15 is supplied onto the solid plate 11 through a supply port 25. The solid plate 11 has a diameter of at least twice or more than the size of the work piece 12 and can move rotationally. The supply port 25 is arranged on the upstream side in the rotational direction of the work piece 12. The other configurations and the planarization method are the same as in the planarization apparatus of the first embodiment shown in FIG. 1.

Figure 5:
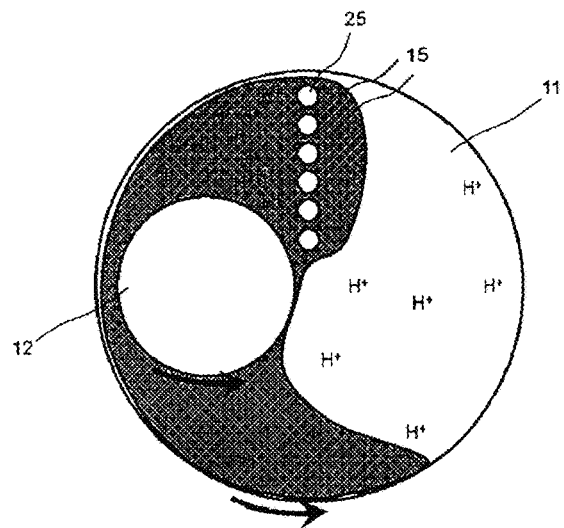
FIG. 5 is a plan view showing the configuration example of the planarization apparatus which planarizes a silicon oxide film according to the second embodiment.

FIG. 5 is a plan view showing the configuration example of the planarization apparatus which planarizes a silicon oxide film according to the second embodiment. As shown in FIG. 5, the supply port 25 is provided on the upstream side of the work piece 12 in relation to the rotational direction of the solid plate 11. Accordingly, the process liquid 15 can be efficiently supplied to a polishing portion of the work piece 12. In addition, as shown in FIG. 5, a plurality of the supply ports 25 may also be provided in a row. An acidic solution containing fluorine ions, for example, is used as the process liquid 15. Accordingly, after the reaction of Chem. (1), even if a location is present in which the re-adsorption of the hydrogen ions 23 and the solid acidic catalyst 22 is insufficient, a fresh acidic solution is supplied onto the solid acidic catalyst 22 before the process liquid 15 makes contact with the work piece 12 again, and a sufficient amount of hydrogen ions can be adsorbed.

[Effects]

In the present embodiment, the silicon oxide film 21 is immersed in the process liquid 15 containing the fluorine ions 24 which do not react by immersion only, and the work surface is brought into contact or extremely close proximity with the surface of the solid plate 11 containing the hydrogen ions 23. Accordingly, the work surface of the silicon oxide film 21 can be planarized by reacting only the work surface of the silicon oxide film 21 which is in contact or extremely close proximity with the surface of the solid plate 11.

In addition, according to the present embodiment, the process liquid 15, which has few impurities and a high purity, can always be supplied onto the solid plate 11. Therefore, the work piece 12 can be polished without the reaction products impeding the adsorption of the solid acidic catalyst 22 and the hydrogen ions 23, or the reaction of Chem. (1).

Furthermore, the usage amount of the process liquid 15 can be reduced in comparison with the method where the process liquid 15 is stored in the container 10 by adjusting the flow amount of the process liquid 15.

Application Example

[Application]

The application example of the planarization methods according to the first embodiment and the second embodiment will be described using FIGS. 6 to 9. The planarization method according to these embodiments can be applied to the Shallow Trench Isolation (STI) formation process of a semiconductor device.

FIGS. 6 to 9 are cross section views showing the STI formation process of a semiconductor device according to the present embodiment.

Figure 6:
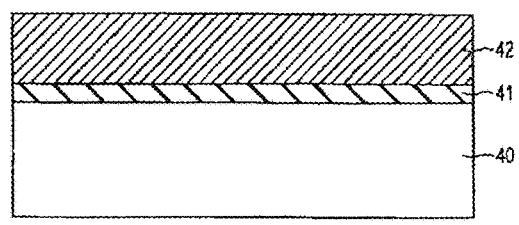
FIG. 6 is a cross section view showing the manufacturing process of the STI structure of a semiconductor device according to the first embodiment and the second embodiment.

First, as shown in FIG. 6, for example, a tunnel insulating film 41 containing a silicon oxide film or a silicon nitrate film is formed on a semiconductor substrate 40 using the Chemical Vapor Deposition (CVD) method. A charge storage film 42 containing a poly-crystalline silicon or an amorphous silicon is formed on the tunnel insulating film 41 using, for example, the CVD method.

Figure 7:
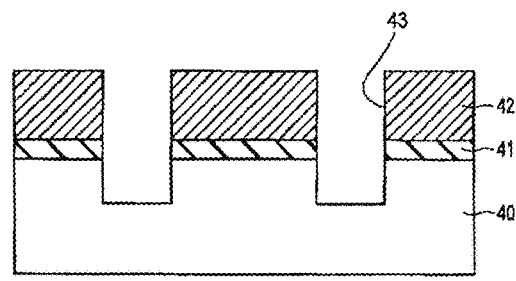
FIG. 7 is a cross section view continuing from FIG. 6, which shows the manufacturing process of the STI structure of the semiconductor device.

Next, as shown in FIG. 7, a groove 43 is formed in the charge storage film 42, the tunnel insulating film 41 and the semiconductor substrate 40 using lithography and RIE (Reactive Ion Etching). The groove 43 is formed passing through the charge storage film 42 and the tunnel insulating film 41 so as to remove a portion of the semiconductor substrate 40.

Figure 8:
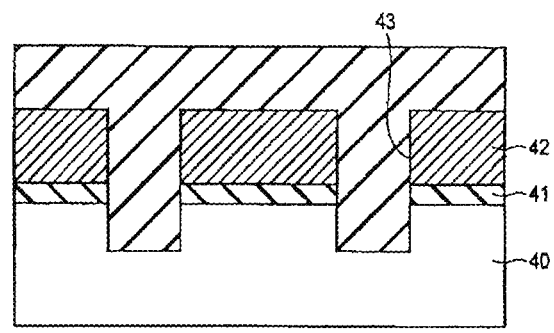
FIG. 8 is a cross section view continuing from FIG. 7, which shows the manufacturing process of the STI structure of the semiconductor device.

Next, as shown in FIG. 8, an element isolation insulating film 44 containing a silicon oxide film on the whole surface thereof is formed using, for example, the CVD method. Accordingly, the element isolation insulating film 44 is embedded within the groove 43, and is also formed on the charge storage film 42 outside the groove 43.

Figure 9:
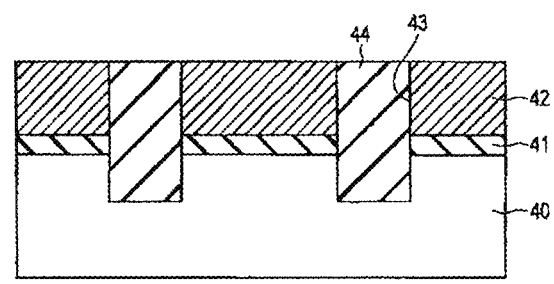
FIG. 9 is a cross section view continuing from FIG. 8, which shows the manufacturing process of the STI structure of the semiconductor device.

Next, as shown in FIG. 9, the element isolation insulating film 44 formed on the charge storage film 42 outside the groove 43 is removed. At this time, the planarization method of the silicon oxide film according to the above embodiments described above is used. More specifically, a surface of the element isolation insulating film 44 is brought into contact with the surface of the solid plate 11 onto which the hydrogen ions 23 are adsorbed, while immersing the surface of the element isolation insulating film 44 in the process liquid 15. In other words, the above planarization method is performed with the surface of the element isolation insulating film 44 containing the silicon oxide film as the work surface. Accordingly, the element isolation insulating film 44, the process liquid 15 and the hydrogen ions 23 react with one another. As a result, the element isolation insulating film 44 formed on the charge storage film 42 outside the groove 43 can be removed while planarizing the surface of the element isolation insulating film 44.

In such a manner, the STI structure is formed in the application example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A planarization apparatus comprising:
a solid plate containing a solid acidic catalyst which is an acidic cation exchanger having a functioning group with an acid dissociation constant of $1.0 \times 10^{-3}$ or less;
a process liquid supply unit which is configured to supply a process liquid; and
a maintaining portion which is configured to hold a work piece and is configured to bring a work surface of the work piece and a surface of the solid plate into contact or extremely close proximity with one another in the process liquid.

2. The planarization apparatus according to claim 1, further comprising:
a heat source connecting to the solid plate to adjust a temperature of the work piece.

3. The planarization apparatus according to claim 1, wherein
the solid plate is configured to be rotatable or slidable.

4. The planarization apparatus according to claim 1, wherein
the maintaining portion is configured to be rotatable or slidable.

5. The planarization apparatus according to claim 1, wherein
the work piece contains a silicon oxide film, wherein the process liquid contains fluorine ions, and wherein the fluorine ions react with the work piece in accordance with a chemical equation of $SiO_2+6F^-+6H^+ \rightarrow SiF6^{2-}+2H^++2H_2O$.

6. The planarization apparatus according to claim 5, wherein
the process liquid is a sodium fluoride aqueous solution, a potassium fluoride aqueous solution, an ammonium fluoride aqueous solution, or a mixed solution of the above and a hydrogen fluoride aqueous solution.

7. A planarization apparatus comprising:
a rotatable solid plate containing a solid acidic catalyst which is an acidic cation exchanger having a functioning group with an acid dissociation constant of $1.0 \times 10^{-3}$ or less;
a process liquid supply unit which is configured to supply a process liquid onto the rotatable solid plate; and
a maintaining portion which is configured to hold a work piece and is configured to bring a work surface of the work piece and a surface of the solid plate into contact or extremely close proximity with one another where the process liquid is supplied to an upper stream side of the rotatable solid plate to flow to the work piece.

8. The planarization apparatus according to claim 7, further comprising:
a heat source connecting to the solid plate to adjust a temperature of the work piece.

9. The planarization apparatus according to claim 7, wherein
the process liquid supply unit has a port such that the process liquid is supplied onto the solid plate through the port.

10. The planarization apparatus according to claim 7, wherein
the process liquid supply unit has a plurality of ports such that the process liquid is supplied onto the solid plate through the plurality of ports.

11. The planarization apparatus according to claim 7, wherein
a diameter of the solid plate is at least twice or more than a diameter of the work piece.

12. The planarization apparatus according to claim 7, wherein
the work piece contains a silicon oxide film, wherein the process liquid contains fluorine ions, and wherein the fluorine ions react with the work piece in accordance with a chemical equation of $SiO_2 + 6F^- + 6H^+ \rightarrow SiF6^{2-} + 2H^+ + 2H_2O$.

13. The planarization apparatus according to claim 12, wherein
the process liquid is a sodium fluoride aqueous solution, a potassium fluoride aqueous solution, an ammonium fluoride aqueous solution, or a mixed solution of the above and a hydrogen fluoride aqueous solution.

* * * * *